United States Patent
Centola et al.

(10) Patent No.: US 6,670,559 B2
(45) Date of Patent: Dec. 30, 2003

(54) ELECTROMAGNETIC SHIELD FOR PRINTED CIRCUIT BOARDS

(75) Inventors: Bruno Centola, Vence (FR); Claude Gomez, Antibes (FR); Patrick Michel, La Gaude (FR); Jacques Feraud, Vence (FR)

(73) Assignee: International Business Machines Corp., Armonk, NY (US)

( * ) Notice: Subject to any disclaimer, the term of this patent is extended or adjusted under 35 U.S.C. 154(b) by 125 days.

(21) Appl. No.: 10/016,426

(22) Filed: Dec. 10, 2001

(65) Prior Publication Data

US 2002/0071265 A1 Jun. 13, 2002

(30) Foreign Application Priority Data

Dec. 13, 2000 (FR) .......................................... 00 480115

(51) Int. Cl.[7] ........................... H01R 12/04; H05K 1/11
(52) U.S. Cl. ...................................... 174/261; 361/818
(58) Field of Search ........................... 174/260, 261, 174/250; 361/753, 818, 799, 800

(56) References Cited

U.S. PATENT DOCUMENTS

| | | | | |
|---|---|---|---|---|
| 4,771,365 A | * | 9/1988 | Cichocki et al. | ........... 165/80.3 |
| 4,855,873 A | * | 8/1989 | Bhargava et al. | ......... 174/38 D |
| 5,500,789 A | * | 3/1996 | Miller et al. | ............... 174/35 R |
| 5,537,294 A | * | 7/1996 | Siwinski | ..................... 235/380 |
| 5,563,450 A | * | 10/1996 | Bader et al. | ................ 257/678 |
| 5,671,123 A | * | 9/1997 | Omori et al. | ............... 361/212 |
| 6,318,902 B1 | * | 11/2001 | Igl et al. | ........................ 385/59 |

\* cited by examiner

Primary Examiner—David L. Talbott
Assistant Examiner—Jeremy Norris
(74) Attorney, Agent, or Firm—Lawrence R. Fraley; Arthur J. Samodovitz

(57) ABSTRACT

An electromagnetic shield device for printed circuit boards (PCBs) which, in one embodiment, is made of conductive material and comprised of two parts. In another embodiment, the device is a singular element. In both examples, press-fit or compliant pins may be used to electrically couple the device to the PCB's ground layer. Alternatively, projecting pins or flat conductive plates can be used to provide this coupling. The device is also adjustable to accommodate PCBs of varying thicknesses. The device provides for added PCB stiffness while assuring prevention of electromagnetic radiation from the PCB's edge.

18 Claims, 4 Drawing Sheets

ELECTROMAGNETIC SHIELD FOR PRINTED CIRCUIT BOARDS

FIELD OF THE INVENTION

The present invention relates to electromagnetic interference and radiation and more specifically to systems that reduce electromagnetic radiation of printed circuit (electronic) boards.

BACKGROUND OF THE INVENTION

The quest for increased performance has driven the development of electronic systems in two directions. First, there has been a dramatic increase of the level of integration that has been achieved in recent years. It is now possible to put on a single piece of semiconductor, millions of transistors running at clock frequency values expressed in hundreds of megahertz or even gigahertz for some components. Secondly, the functions to be executed are often distributed among subsystems to perform various tasks in parallel. Such a situation is typically encountered in the field of computer networks and telecommunications wherein the data are processed simultaneously in several subsystems. As a consequence of this miniaturization and high speed data transfer, electromagnetic radiation by such apparatus has increased dramatically. It is understandably necessary to properly deal with such radiation in order to prevent signals to be corrupted and to comply with international standards, such as ElectroMagnetic Compatibility (EMC).

Although there exist various means to reduce electromagnetic radiation from the surfaces of printed circuit boards (PCBs), such efforts typically fail to take the electromagnetic radiation of the board edges into account since, until recently, such radiation has been relatively negligible. However, considering the increased performance of many of today's computer networks and telecommunications, the number of signals and corresponding transmission speeds have reached a level where edge correction is deemed necessary.

One known common approach to handling this problem involves designing the PCB to optimize placement of the PCB's electronic devices and internal board layers. A particular rule, commonly known as the "20 h rule", reduces electromagnetic radiation emitted by such board edges by a factor of about 90%. FIG. 1 represents a section of a part of a PCB 100 comprising several internal layers, including ground, voltage and signal, referred to as 110, 120 and 130 respectively. The "20 h rule" determines the minimum distance between the voltage layer to the closest board edge (referred to as H) as a function of the minimum distance between the ground layer to the voltage layer, referred to as h. Using this rule, the distance H must be greater or equal to 20 h. If such a design restriction reduces board edge electromagnetic radiation, it still presents several drawbacks since it is surface consuming and limited to an electromagnetic radiation threshold of about 90% (as mentioned above).

Another known solution involves surrounding the electronic board with vias connected to a ground layer, as illustrated on FIG. 2. The maximum distance between two vias (referred to as 200 in the drawing) is determined by data transmission speeds and clock frequencies. When dealing with high data transmission speeds and clock frequencies, it is necessary to closely position such vias. Understandably, such a requirement is not cost effective.

A third known approach involves metallizing the edges of the board, as illustrated on FIG. 3. Such a solution is considered efficient because it provides a continuous conductive shield (referred to as 300) of the board edges. However, such an approach is also considered relatively expensive since it requires an additional step in the manufacturing process.

It is believed, therefore, that a cost effective and relatively easy to use in manufacturing approach that effectively reduces electromagnetic radiation would constitute an advancement in the art.

OBJECTS AND SUMMARY OF THE INVENTION

It is, therefore, a primary object of the present invention to enhance the PCB art.

It is a more particular object of the invention to provide a cost effective, relatively easy to use method (and resulting product) for effectively reducing electromagnetic radiation from the edges of PCBs.

It is another object of the invention to provide such a method (and product) that is adapted to stiffen the board.

It is still another object of the invention to provide such a product that is readily adaptable for guiding, mounting and fastening the PCB within a rack or a chassis designed to accommodate same.

It is yet a further object of the invention to provide such a structure that is adapted to provide electrical contact between the PCB and the rack or chassis ground circuitry.

The accomplishment of these and other related objects is achieved by a PCB which comprises a substrate having a first edge portion and including a ground layer therein, a substantially U-shaped device secured to the PCB to provide a cover for the first edge portion, and connection means for electrically coupling the substantially U-shaped device to the ground layer within the substrate, the substantially U-shaped device substantially preventing electromagnetic radiation from being emitted from the first edge portion.

Further advantages of the present invention will become apparent to those skilled in the art upon examination of the drawings and followed detailed description.

BEST MODE FOR CARRYING OUT THE INVENTION

In its broadest aspects, the invention includes the utilization of a conductive shield, linked to the ground conductor(s) of a PCB, that is oriented on the PCB's edges so as to absorb electromagnetic radiation emitted by the PCB at its edges.

Figure 1:
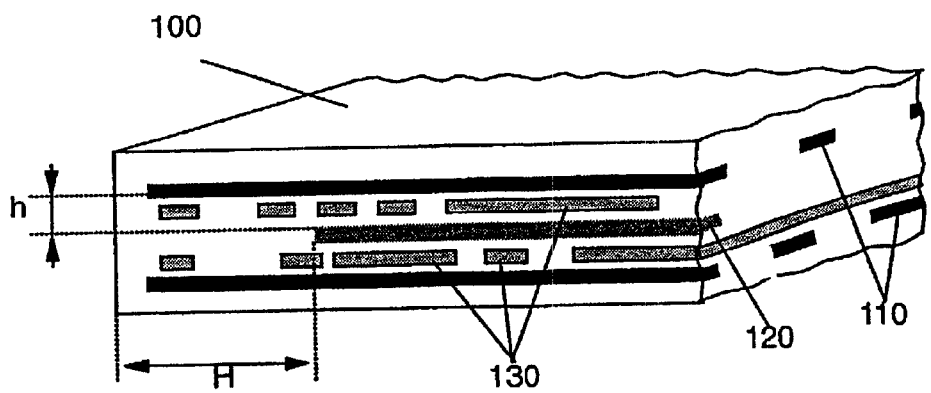
FIG. 1 illustrates the aforementioned "20 h rule" used for electronic board design.
Figure 2:
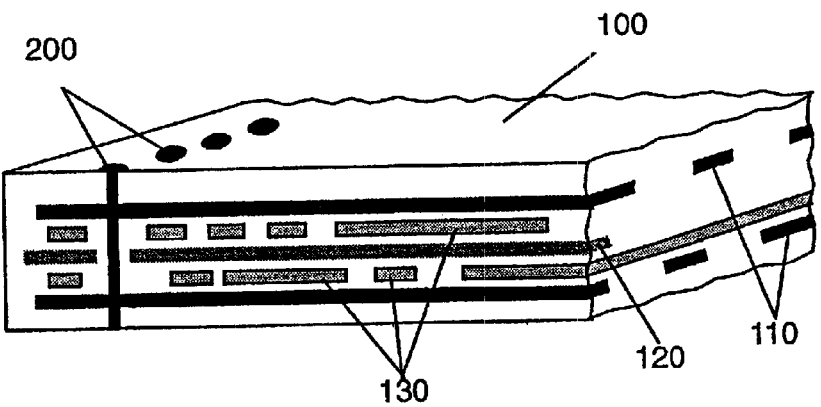
FIG. 2 depicts the use of vias connected to a PCB ground layer.
Figure 3:
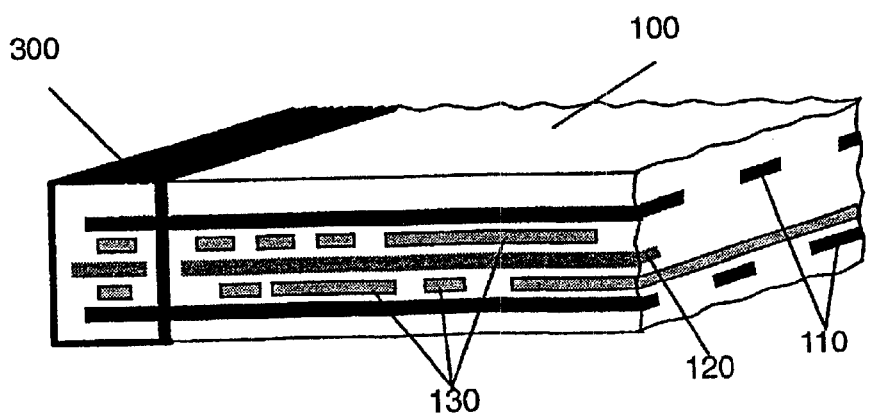
FIG. 3 illustrates the known metallization of a PCB edge.
Figure 4:
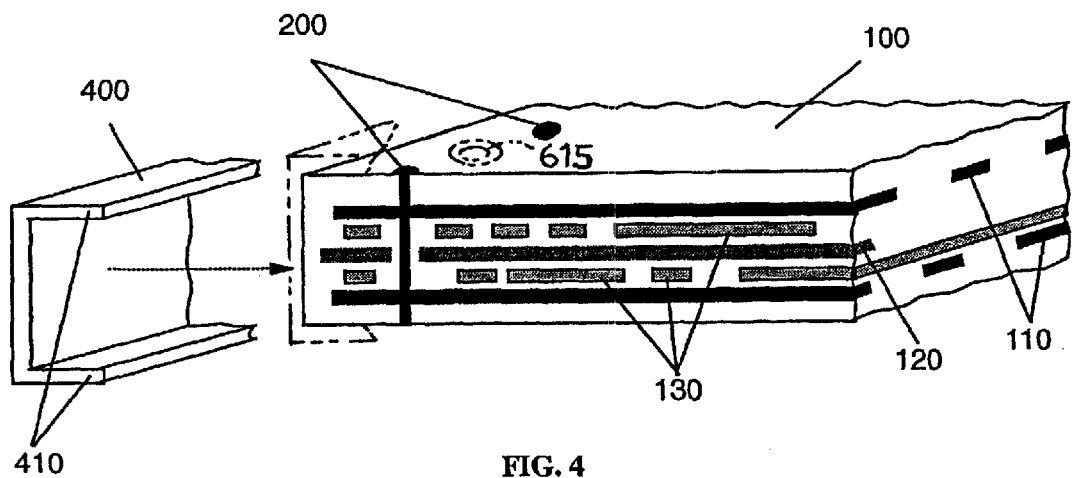
FIG. 4 illustrates one embodiment of the invention.

FIG. 4 illustrates the above mentioned concept of the invention, where a conductive U-shaped device, referred to as 400, is shown as being positioned on the edge of a PCB 100. Actually, device 400 is shown slightly spaced from the edge of PCB 100, but it is to be understood that the device is to be moved in the direction indicated (by the arrow in FIG. 1) so as to fit on the PCB and cover the edge (and, of course, portions of the PCB's upper and lower surfaces). As understood from the following, the device will abut the PCB edge surface. Part of device 400 is shown in position on PCB 100 in phantom in FIG. 4. In FIG. 4, the PCB's ground, voltage and signal layers, 110, 120 and 130, respectively, are also shown, as are vias 200 (albeit much more widely spaced than in FIG. 2) and at least one PTH (see more below). (PCB 100 comprises a substrate of known material (e.g., fiberglass-reinforced resin) having the designated number of conductive layers 110, 120 and 130 therein. Such PCB's are of known construction and further description is not necessary.) Since standard multilayer PCB manufacturing processes are not capable of providing constant and precise distances between the two surfaces (upper and lower) of a PCB, the terminal parts of U-shaped device 400, referred to as 410, must be relatively flexible. For example, U-shaped device 400 may be made of metal (e.g., copper) or conductive elastomer material. Electrical contact between U-shaped device 400 and ground layers 110 is possible through vias 200 surrounding the electronic board, these vias being engaged by terminal parts 400 when device 400 is fully positioned on PCB 100. This connection between the flexible terminal parts 410 and via ends may be improved by depositing conductive material over the vias that will project slightly upward from the respective surface of the PCB 100. Electrical contact between U-shaped device 400 and the PCB 100 ground layer(s) could also be accomplished without requiring vias. For example, an external conductive (e.g., copper) element may surround the PCB (e.g., as a ring) so that terminal parts 410 will exert a pressure against it. Such an element may also be tinned to further protect it.

Figure 5:
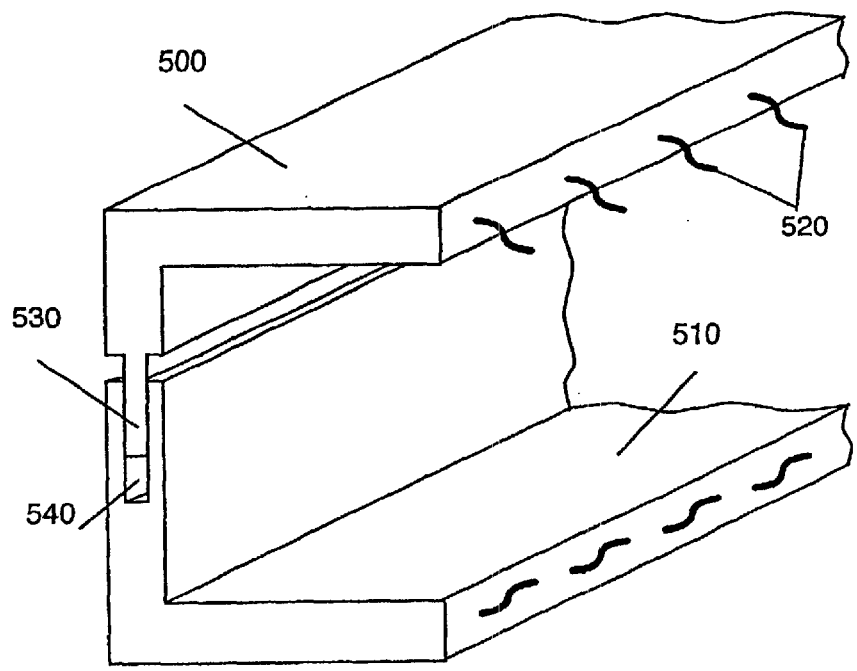
FIGS. 5 to 9 depict various other, more detailed embodiments of the present invention.

FIG. 5 illustrates one embodiment of U-shaped device 400. Device 400 comprises two L-shaped parts, referred to as 500 and 510. Each L-shaped part includes pins 520 positioned along the edges of these parts as depicted. These pins are adapted for being connected to (e.g., soldered) conductive vias 200 (or a metallic, appropriately shaped member (not shown) surrounding electronic board 100). This connection provides good electrical contact between the PCB's ground layer(s) and parts 500 and 510. To accommodate varying PCB 100 thicknesses (that, as stated above, may vary from one electronic board to another), part 500 comprises a ledge, referred to as 530, and part 510 comprises a cavity, referred to as 540. Ledge 530 is adapted for being movably located within cavity 540 so that the distance between the legs of L-shaped parts 500 and 510 can be adjusted to accept these varying thicknesses. The internal surfaces of L-shaped parts 500 and 510 may then be permanently secured (e.g., with adhesive) to PCB 100. Likewise, ledge 530 may be secured at the proper location within cavity 540, e.g., using adhesive. To further improve electromagnetic radiation shielding and still assure a sound electrical contact between L-shaped parts 500 and 510, such adhesive should be electrically conductive.

Figure 6:
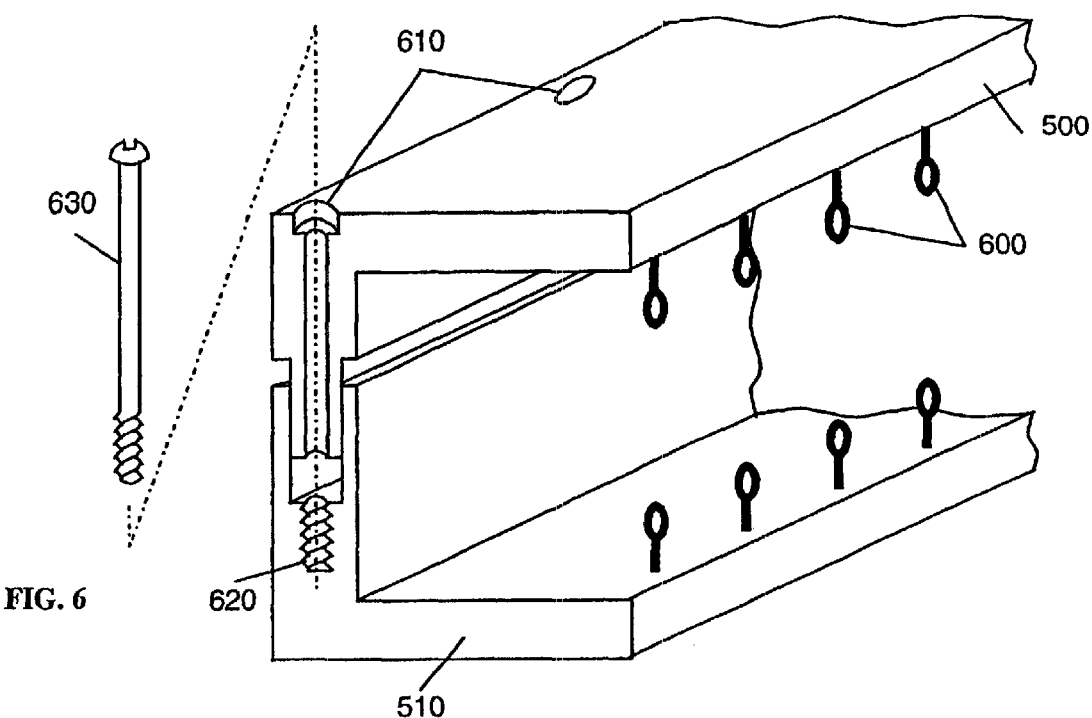

FIG. 6 depicts a second embodiment of the invention, the shielding device in FIG. 6 comprising slightly different L-shaped parts 500 and 510. Briefly, the solderable pins 520 of FIG. 5 are replaced by press-fit or compliant pins, referred to as 600. Pins 600 are adapted for being inserted within corresponding plated through holes strategically positioned with PCB 100. Plated through holes (or PTHs) are well known in the PCB art and are understood to be openings through the board having conductive material (e.g., plated copper) therein. PTHs are shown in U.S. Pat. Nos. 6,046,911 (no. 29), 6,125,530 (no. 15) and 6,207,354 (no. 7). A PTH is also shown in phantom in FIG. 4, and referred to by the numeral 615. Further description is unnecessary. Such press-fit or compliant pins 600 serve to establish electrical contact with the conductive PTHs and also fasten L-shaped parts (500 and 510) to PCB 100. In this example, L-shaped parts 500 and 510 further comprise holes 610 and tapped holes 620 respectively. These holes are made within L-shaped parts 500 and 510 so that fastening screws 630 (only one shown in FIG. 6) may go through L-shaped part 500 and screw into the lower part 510. Screws 630 are thus used to fasten L-shaped parts 500 and 510 onto electronic board 100, as illustrated. Thus, the shielding device of FIG. 6 is also adapted to accommodate different electronic board thickness. It is also to be noted that holes 610 and tapped holes 620 can be located further toward the edge of each projecting leg portion of L-shaped parts 500 and 510 so that screws 630 also go through PCB 100.

Figure 7:
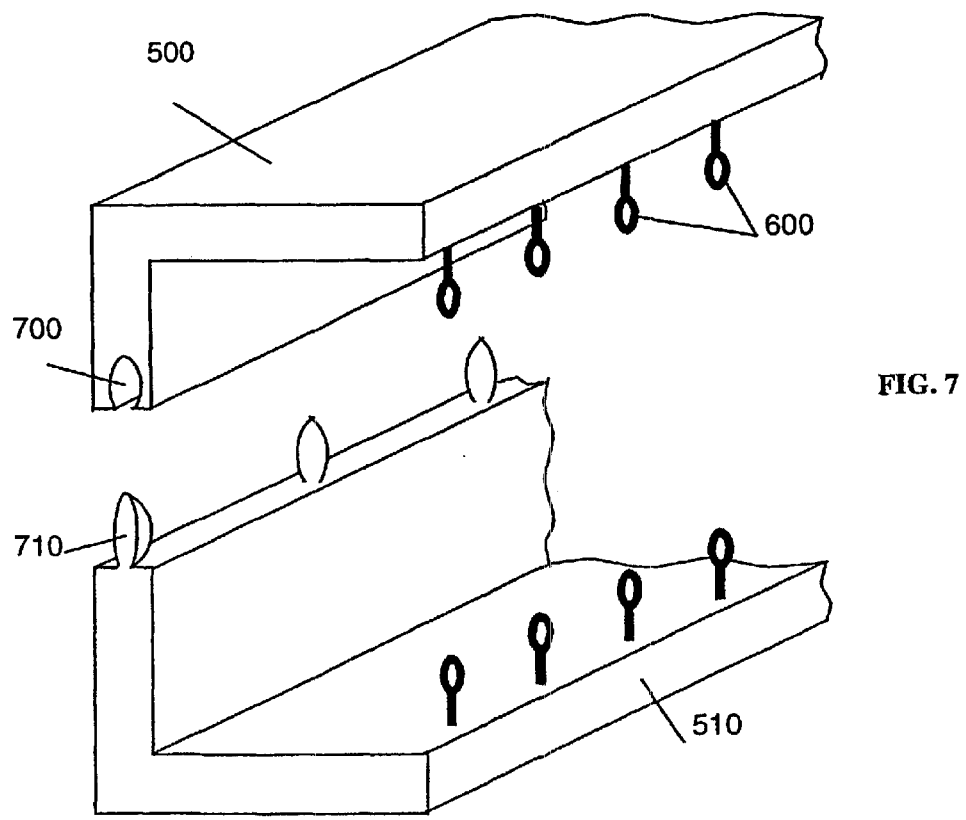

FIG. 7 illustrates a third embodiment of the shielding device of the invention, the device in FIG. 7 comprising L-shaped parts 500 and 510 wherein the ledge 530 and cavity 540 elements of FIG. 5 are replaced by fastening mechanisms, that operate like rivets, to crimp L-shaped parts 500 and 510 together on PCB 100. Fastening mechanisms, disposed along L-shaped parts 500 and 510 edges, comprise cavities 700 and elongated projecting parts 710 (the latter made of distortable (compressible) material). When L-shaped parts 500 and 510 are positioned onto PCB 100, elongated projecting parts 710 enter cavities 700 and are compressed so as to couple L-shaped parts 500 and 510. The embodiment in FIG. 7 also preferably utilizes pins 600 which function similarly to pins 600 in FIG. 6.

Figure 8:
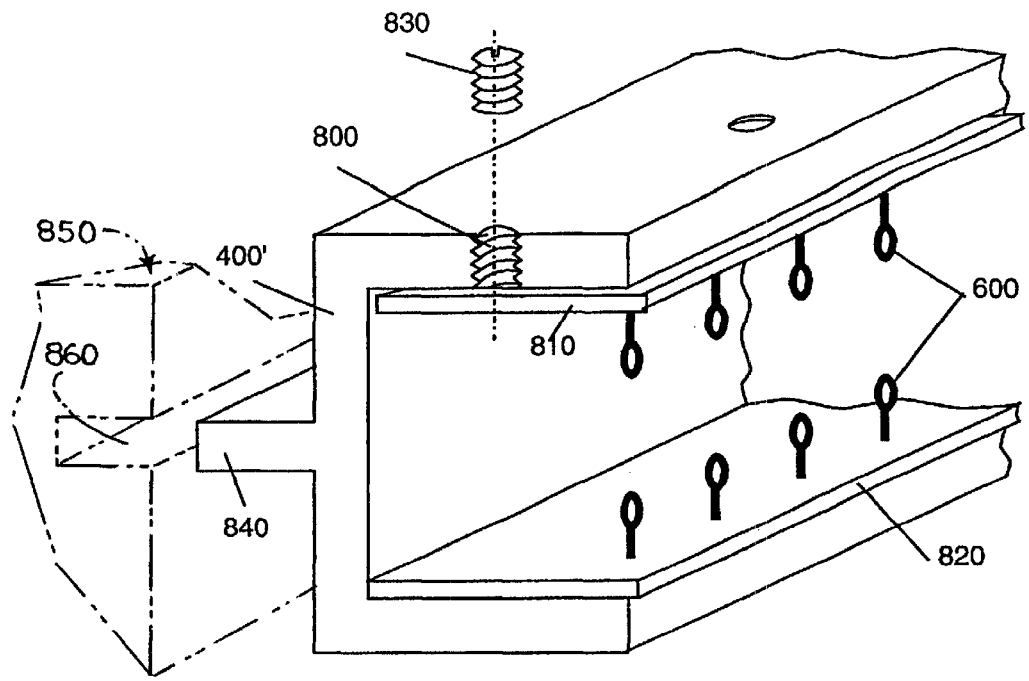

FIG. 8 is still another embodiment of the shielding device of the invention, wherein a singular piece (unitary) U-shaped member 400' includes tapped holes 800 on one side surface, as depicted. Two conductive plates 810 and 820 are also utilized, these plates being positioned between the projecting portions (sides) of member 400' and adapted for engaging opposite surfaces of PCB 100 (when screw(s) 830 are screwed into hole(s) 800). Conductive plates 810 and 820 also include press-fit or compliant pins 600 so as to provide electrical contact between the PCB's ground layers and the conductive plates. As described above, press-fit or compliant pins 600 are adapted to be inserted into corresponding plated through holes located within PCB 100 and linked to its ground layers. Screws 830 are screwed in tapped holes 800 to exert pressure on electronic board 100 between conductive plates 810 and 820 and thus provide electrical contact with the also conductive U-shaped member 400'. In order to position U-shaped member 400' in place on PCB 100, conductive plates 810 and 820 are first pinned onto electronic board 100 and then the U-shaped member 400' is coupled to it and fastened using screws 830. In this example, U-shaped member 400' further comprises ledge 840 on its external base surface which can be used as a guide during insertion and extraction of PCB 100 from a corresponding rack or chassis in which PCB 100 is to be finally positioned. Ledge 840, being conductive, can also provide an electrical connection between the ground layers of PCB 100 and the rack or chassis in which it is mounted. Such a rack or chassis 850 is partially shown in phantom in FIG. 8, including having such a receiving slot 860 therein.

Figure 9:
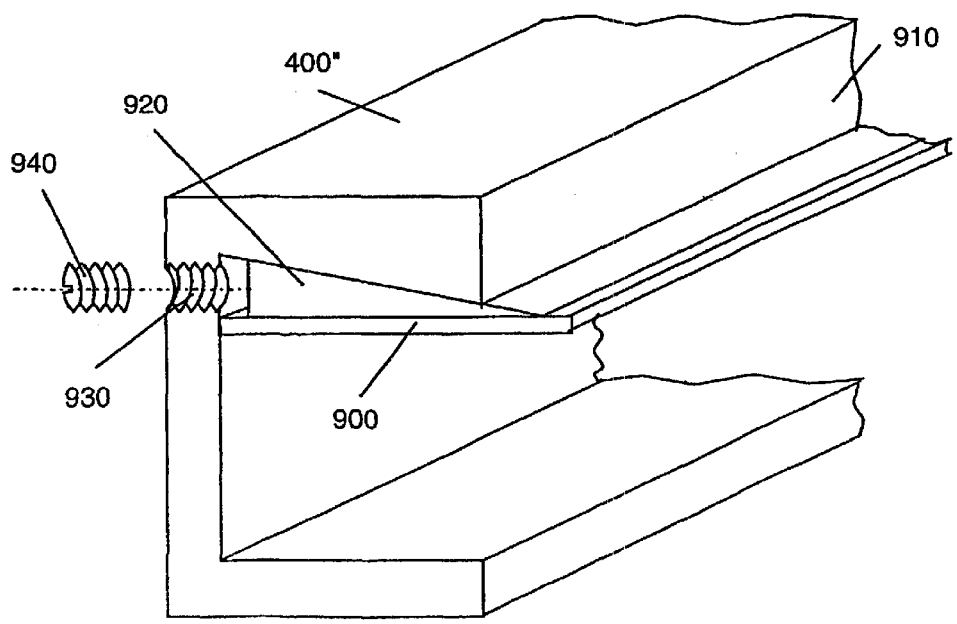

FIG. 9 represents still another embodiment of the invention wherein electrical contact is obtained using pressure. PCB 100 (not shown) is gripped within a singular piece U-shaped member, now referred to as 400". A conductive plate 900 is also utilized as part of the pressure application structure. In this example, the mechanism used to exert pressure on conductive plate 900 (and thus onto PCB 100) differs from that in FIG. 8 by using slidable movement of a wedge-shaped member 920 which is engaged through the base of member 400". The upper side of U-shaped member 400" that is slidably engaged by member 920 (but not PCB) possesses a triangular (wedge-shaped) profile, and is referred to in FIG. 9 as 910. Triangular leg 910 is thus used in combination with the also triangular member 920 so as to provide the desired pressure onto conductive plate 900. U-shaped member 400" further comprises tapped holes 930 positioned along the base so that screws 940 may be used to exert pressure against triangular member 920, as illustrated. Thus, when screws 940 are screwed in tapped holes 930, screws 940 push triangular member 920 (to the right in FIG. 9) such that the desired pressure is exerted on conductive plate 900, and therefore onto the PCB 100 when PCB 100 is positioned between the legs of member 400". Electrical contact between conductive plate 900 and the PCB ground layer(s) can also be accomplished using vias 200 (or a conductive element on the PCB's outer surfaces) as mentioned in the FIG. 4 embodiment. Electrical contact may be further improved when using such vias by depositing conductive material over the vias so that said material will be directly contacted by the compressible plate 900 (and the lower conductive leg of member 400").

As apparent from FIGS. 4 to 9, the structure of the described electromagnetic shielding member defined herein provides both a stiffening component for PCB 100 while simultaneously providing electromagnetic shielding for the board's edge portion. Such stiffening facilitates subsequent PCB 100 insertion within and removal from a rack or chassis 850. Such a feature is also important when dealing with PCBs having a large number of electronic devices (or large electronic devices) thereon, to prevent damage to the devices and particularly the solder connection used to couple these to the PCB. Furthermore, as defined above, the U-shaped device can also be used to provide an electrical ground path to the rack or chassis from the PCB's ground layers. The U-shaped device as defined herein can be made of any suitable metallic material, one example being copper.

While there have been shown and described what are at present the preferred embodiments of the invention, it will be obvious to those skilled in the art that various changes and modifications may be made therein without departing from the scope of the invention as defined by the appended claims.

What is claimed is:

1. A printed circuit board (PCB) assembly comprising:
    a multi-layer printed circuit board substrate having a side edge, first and second opposite surfaces, and signal and ground conductors;
    a conductive channel enclosing said side edge, said channel being electrically connected to said ground conductor to provide electromagnetic shielding of said side edge; and
    a plate within said channel substantially parallel to said first surface, and means for moving said plate toward said first surface such that said plate and an opposite surface of said channel engage said printed circuit board about said side edge, said plate being electrically connected to said ground conductor.

2. The PCB of claim 1 wherein a cross-section of said channel in a plane perpendicular to said first and second surfaces and said side edge is substantially U-shaped.

3. The PCB of claim 1 wherein said moving means comprise an adjustment screw which engages said plate.

4. The PCB of claim 3 wherein said adjustment screw is mounted in a threaded bore in said channel perpendicular to said plate.

5. The PCB of claim 3 wherein said adjustment screw is mounted in a threaded bore in said channel parallel to said plate.

6. The PCB of claim 1 wherein said channel includes pins perpendicular to said first surface to mount in conductive holes in said printed circuit board to electrically connect said channel to said ground conductor.

7. The PCB of claim 1 wherein said PCB is adapted for being positioned within a rack or chassis, said PCB including means for electrically coupling said substantially U-shaped device to said rack or chassis.

8. The PCB of claim 7 wherein said means for electrically coupling said substantially U-shaped device to said rack or chassis comprises a projecting ledge, said projecting ledge adapted for slidably engaging said rack or chassis.

9. The PCB of claim 8 wherein said projecting ledge is electrically coupled to said connection means.

10. The PCB of claim 1 wherein said substantially U-shaped device is secured to said PCB by adhesive.

11. A printed circuit board (PCB) comprising:
    a substrate having a first edge portion and including a ground layer therein;
    a substantially U-shaped device secured to said PCB to provide a cover for said first edge portion; and
    connection means for electrically coupling said substantially U-shaped device to said ground layer within said substrate, said substantially U-shaped device substantially preventing electromagnetic radiation from being emitted from said first edge portion; and
    wherein aid substantially U-shaped device is of unitary construction; and further comprising
        at least one conductive plate movably positioned within said substantially U-shaped device to be electrically coupled to said ground layer within said PCB.

12. The PCB of claim 11 further including means for engaging said at least one conductive plate to cause said plate to move within said substantially U-shaped device.

13. The PCB of claim 12 wherein said means for engaging said at least one conductive plate comprises a screw.

14. The PCB of claim 12 wherein said conductive plate further includes a wedge-shaped member which movably engages said substantially U-shaped device during said movement within said device.

15. A printed circuit board (PCB) comprising:
    a substrate having a first edge portion and including a ground layer therein;
    a substantially U-shaped device secured to said PCB to provide a cover for said first edge portion; and
    connection means for electrically coupling said substantially U-shaped device to said ground layer within said substrate, said substantially U-shaped device substantially preventing electromagnetic radiation from being emitted from said first edge portion; and
    wherein said PCB further includes electrically conductive vias or plated through holes (PTHs) as part thereof and coupled to said ground layer, said connection means including a plurality of projecting pins adapted for electrically contacting said conductive vias or said PTHs when said substantiallY U-shaped device is secured to said PCB.

16. The PCB of claim 15 wherein said projecting pins are press-fit or compliant pins.

17. A printed circuit board assembly comprising:
    a multi-layer printed circuit board substrate having a side edge, first and second opposite surfaces, and signal and ground conductors;

a conductive channel enclosing said side edge, said channel being electrically connected to said ground conductor to provide electromagnetic shielding of said side edge, said conductive channel comprising first and second plates substantially parallel to said first and second opposite surfaces, a third plate connected to said first plate perpendicular thereto, and a fourth plate connected to said second plate perpendicular thereto, said third plate comprising a tongue portion extending into a recess in said fourth plate, said third and fourth plates being peripheral of said side edge; and a threaded fastener within said third and fourth plates perpendicular to said first and second plates to control how far said tongue extends into said recess and thereby a spacing between said first and second plates such that said first and second plates engage said opposite surfaces of said printed circuit board.

18. A printed circuit board as set forth in claim 17 wherein at least one of said first and second plates includes pins projecting inwardly of said channel and secured in holes in said printed circuit board to ground said channel.

* * * * *